United States Patent
Rosetti

(10) Patent No.: US 10,491,185 B2
(45) Date of Patent: Nov. 26, 2019

(54) FILTER ARRANGEMENT WITH COMPENSATION OF POOR ELECTRICAL GROUND

(71) Applicant: EPCOS AG, München (DE)

(72) Inventor: Luigi Rosetti, München (DE)

(73) Assignee: SnapTrack, Inc., San Diego, CA (US)

( * ) Notice: Subject to any disclaimer, the term of this patent is extended or adjusted under 35 U.S.C. 154(b) by 64 days.

(21) Appl. No.: 15/572,702

(22) PCT Filed: May 11, 2015

(86) PCT No.: PCT/EP2015/060353
§ 371 (c)(1),
(2) Date: Nov. 8, 2017

(87) PCT Pub. No.: WO2016/180466
PCT Pub. Date: Nov. 17, 2016

(65) Prior Publication Data
US 2018/0123552 A1   May 3, 2018

(51) Int. Cl.
| | |
|---|---|
| *H03H 7/46* | (2006.01) |
| *H03H 9/05* | (2006.01) |
| *H03H 9/70* | (2006.01) |
| *H03H 7/01* | (2006.01) |
| *H03H 9/64* | (2006.01) |

(52) U.S. Cl.
CPC .......... *H03H 7/466* (2013.01); *H03H 7/1708* (2013.01); *H03H 9/0566* (2013.01); *H03H 9/6436* (2013.01); *H03H 9/70* (2013.01)

(58) Field of Classification Search
CPC ... H01P 5/12; H03H 7/46; H03H 7/48; H03H 7/466; H03H 7/1708; H03H 9/70; H03H 9/6436; H03H 9/0566
See application file for complete search history.

(56) References Cited

U.S. PATENT DOCUMENTS

| | | |
|---|---|---|
| 2010/0026419 A1 | 2/2010 | Hara et al. |
| 2010/0244979 A1 | 9/2010 | Matsuda et al. |
| 2015/0130551 A1 | 5/2015 | Ouchi |

FOREIGN PATENT DOCUMENTS

| | | |
|---|---|---|
| EP | 2381576 A1 | 10/2011 |
| JP | 2009105555 A | 5/2009 |
| JP | 2010041141 A | 2/2010 |
| JP | 2010154437 A | 7/2010 |
| JP | 2010192974 A | 9/2010 |
| WO | WO-2010073377 A1 | 7/2010 |

(Continued)

OTHER PUBLICATIONS

International Search Report and Written Opinion—PCT/EP2015/060353—ISA/EPO—dated Jan. 15, 2016.

(Continued)

*Primary Examiner* — Robert J Pascal
*Assistant Examiner* — Kimberly E Glenn
(74) *Attorney, Agent, or Firm* — Patterson & Sheridan, L.L.P.

(57) ABSTRACT

In a filter arrangement comprising a frequency filter (F) that has a bad or non-ideal ground connection (GC1, 2, 3, 4, 5, 6, 7), the defects arising from bad ground are compensated by a capacitance (CC) coupled in parallel to the frequency filter. The value of the capacitance is chosen between 1 and 50 fF. The filter arrangement may be a receiving filter (RF) in a duplexer (DU).

5 Claims, 5 Drawing Sheets

(56) References Cited

FOREIGN PATENT DOCUMENTS

WO    WO-2014021042 A1    2/2014

OTHER PUBLICATIONS

Figure 1:
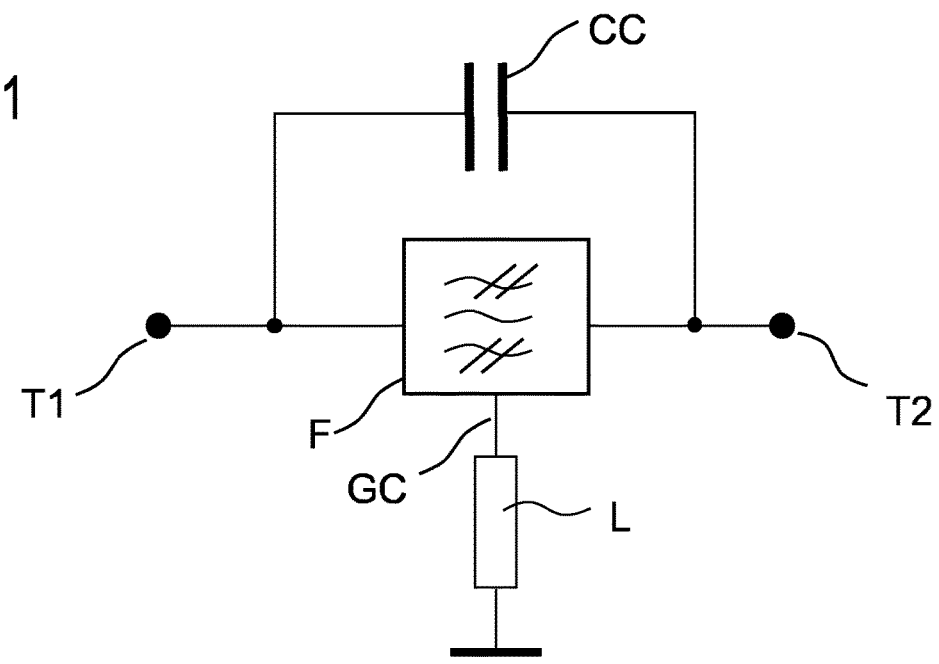

Makkonen T., et al., "Surface Acoustic Wave Impedance Element ISM Duplexer: Modeling and Optical Analysis", IEEE Transactions on Ultrasonics, Ferroelectrics and Frequency Control, IEEE, US, vol. 48, No. 3, May 2, 2001 (May 2, 2001), pp. 652-665, XP011438287, ISSN: 0885-3010, DOI: 10.1109/58.920688.

FILTER ARRANGEMENT WITH COMPENSATION OF POOR ELECTRICAL GROUND

CROSS-REFERENCE TO RELATED APPLICATION

This application is a national stage application under 35 U.S.C. 371 of PCT/EP2015/060353, filed May 11, 2015, which is incorporated herein by reference in its entirety.

Frequency filters that are mounted on substrates often show a degradation of stop band attenuation and in a respective duplexer a bad mutual isolation between the transmission and receiving filters of the duplexer.

These problems are due to a bad ground connection which, on the other hand, is the result of increasing miniaturization of devices used for mobile communication. By trying to continuously reduce chip size of filters and periphery thereof, the number of ground pins that are present in the 15 footprint of the chips are reduced resulting in an degraded ground or non-ideal ground.

When trying to design a block diagram of such a degraded filter, the degradation can be simulated by coupling an inductance L to one or more of the ground pins of the filter. The consequence is a reduced attenuation at frequencies below the passband and remote from the passband at frequencies above the passband.

It is therefore an object of the invention to provide a filter which avoids the above-mentioned problems. Another object of the invention is to provide a filter that has an improved attenuation in the near and far away stop band.

These and other objects are solved by a filter arrangement according to claim 1. Further details of the invention as well as advantageous embodiments are given by further dependent claims.

The filter arrangement according to the invention comprises a frequency filter that is connected between a first and a second terminal. Besides this signal line between the first and second terminal, at least one ground connection of the frequency filter is present. The ground connection comprises coupling to a non-ideal ground.

To compensate for the disadvantages that arise from this bad ground, a capacitance is coupled in parallel to the frequency filter. The value of the capacitance is low and is chosen between 1 and 50 fF. By coupling such a small capacitance parallel to the frequency filter, the attenuation in the stop bands below and above the passband is improved. With the invention, a filter can be achieved that shows a transfer function that has nearly the same quality as an ideal filter with ideal ground in the stop band below the passband.

A frequency filter having such an additional capacitance of such a small value can be manufactured with a very low additional effort such that an inventive frequency filter is achieved at low additional cost. Moreover, the additional capacitance can be realized as a parasitic capacitance which can be done by reducing the distance between first and second terminals.

In a preferred embodiment the capacitance is formed as a discrete structure that allows an exact setting of the capacitance value which is necessary for an optimal compensation.

The invention can be used for frequency filters that—without applying the invention—have a behavior different to an ideal behavior. Such a non-ideal behavior can be simulated in a block diagram of the filter by a disturbing inductance that is coupled to at least one ground connection of the frequency filter. The value thereof can be chosen at about 0.1 nH. Greater disturbances or averse non-ideal behavior can be simulated by an inductance having a value greater than 0.1 nH, for example by an inductance of 0.3, 0.6, 0.9 or around 1 nH. Introducing such a disturbing inductance into the block diagram of the filter exactly depicts the degradation on the one side and—on the other side—by introducing the compensating capacitance parallel to the frequency filter, the compensation of the degradation by this capacitance.

It can be shown that the amount of the compensation is dependent on the exact setting of the compensating capacitance value. This means the given value of the disturbing inductance requires setting an exact value of compensating capacitance.

Such an additional capacitance can hence be used to introduce a "tuneable stop band" into a filter. Thereby the additional pole produced by the resonator can be shifted to a desired frequency in the stopband. The capacitance may be tuned by laser ablation or influenced otherwise by mechanical impact for example. Further methods are possible too that allow to reduce the value of the compensating capacitance. By tuning the capacitance value the such produced pole in the transfer function is shifted. It is thus advantageous to introduce a capacitance having an at least slightly bigger value than expected to be necessary.

When testing the filter's transfer function the capacitance can be tuned at a late stage of the process and, for example, after implementation of the filter in a device at the customer that is not the manufacturer of the filter. By doing this the environment within or around the customer's device can be taken into account to adapt the filter behavior accordingly. A bad ground in a customer's device can be compensated.

The frequency filter may be a band pass filter. But other types of filters may be embodied according to the invention like low pass filters, high pass filters or notch filters.

In an embodiment of the invention, the filter arrangement comprises a duplexer. A duplexer has at least three terminals and a series of ground connections. The compensating capacitance is coupled between at least one input port and one output port of the duplexer. As a duplexer has two filters, one of them being a receiving filter, the other being a transmission filter the compensating capacitance is coupled in parallel only to the receiving filter.

In a preferred embodiment of the invention, the frequency filter is the receiving filter; the compensating capacitance is coupled between input and output of the receiving filter.

It is assumed that the compensating capacitance and the disturbing inductance together form a resonance circuit and hence, a filter resonator. The resonance frequency of this resonator can be set by choosing and setting desired values of capacitance dependent on the value of the disturbing inductance. The effect of the invention is achieved by setting the resonance frequency at a frequency in the stop band of the filter to which the compensating capacitance is coupled to. The invention allows to set the resonance frequency at a stop band below the passband of the frequency filter or above the passband of the filter. Moreover, it is possible to form two or more resonance circuits if different ground connection of the frequency filter are disturbed by different values of inductances which together with a compensating capacitance form different resonance circuits having different resonance frequencies.

According to an embodiment of the invention, the frequency filter is a receiving filter of a duplexer. The duplexer comprises this receiving filter and a transmission filter, the passbands of these two filters being centered at frequencies that are adjacent to each other and distant by the duplexing distance. This duplexing distance may be very small and depends on the frequency band definitions and may be, for example, 80 MHz. In this advantageous embodiment, the resonance circuit is set to a resonance frequency within the passband of the transmission filter. As the resonance resonance circuit produces a pole at the resonance frequency in the transfer function, this leads to an improved attenuation of the transmission frequency within the band of the receiving filter.

The first and the second terminals of the frequency filters are usually assigned to input and output terminals of the frequency filter. Then, one of the terminals is an antenna terminal. The compensating capacitance is then coupled between the first and the second terminal.

In the following, the invention is explained in more detail by embodiments and the respective FIGS. 1 to 10.

Figure 2:
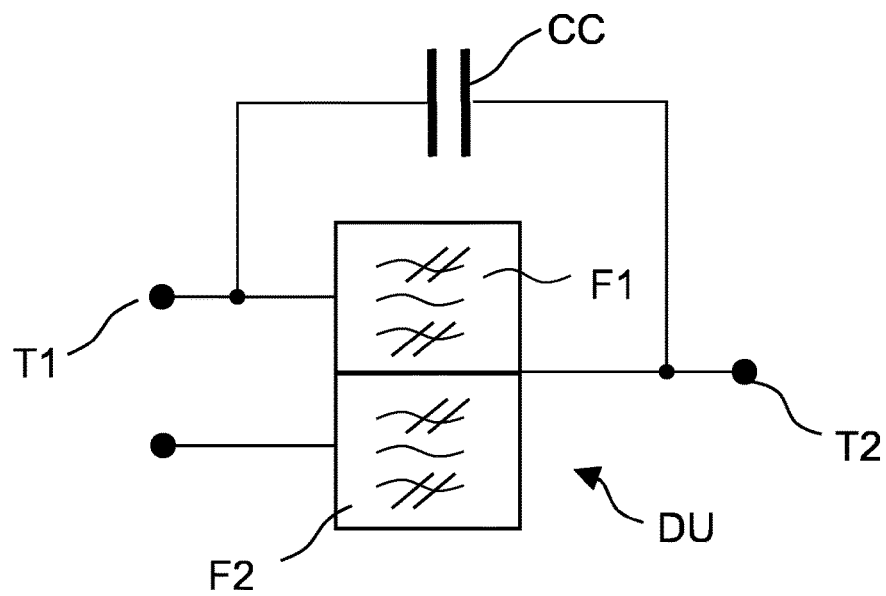
Figure 3:
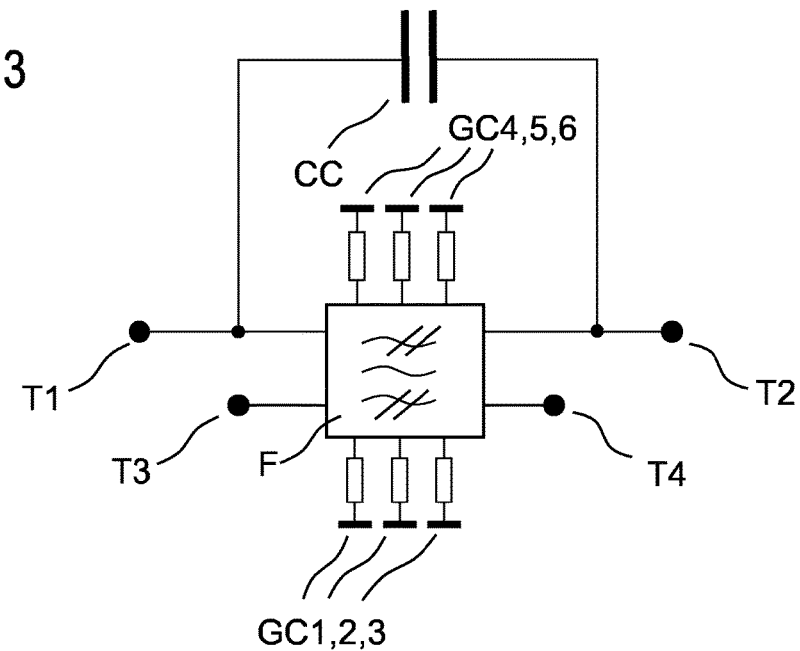
Figure 4:
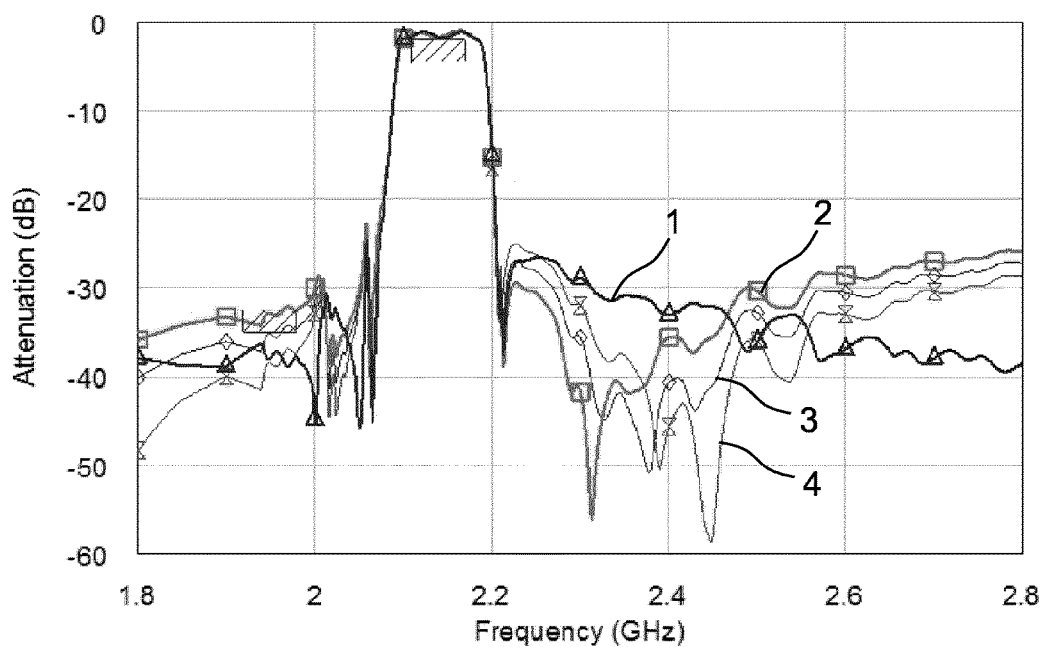
Figure 5:
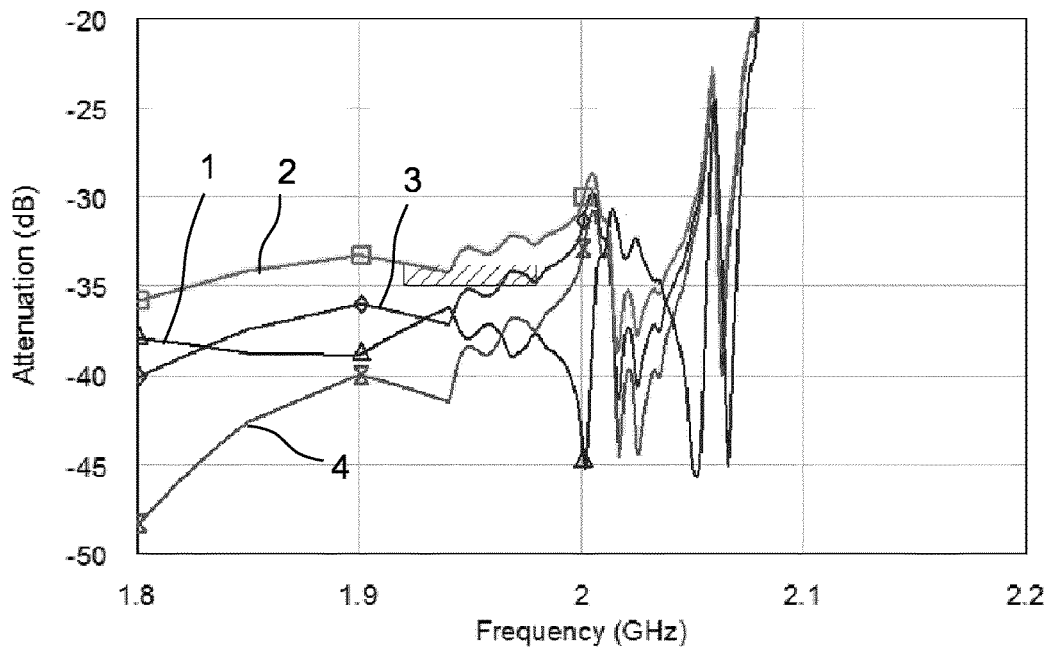
Figure 6:
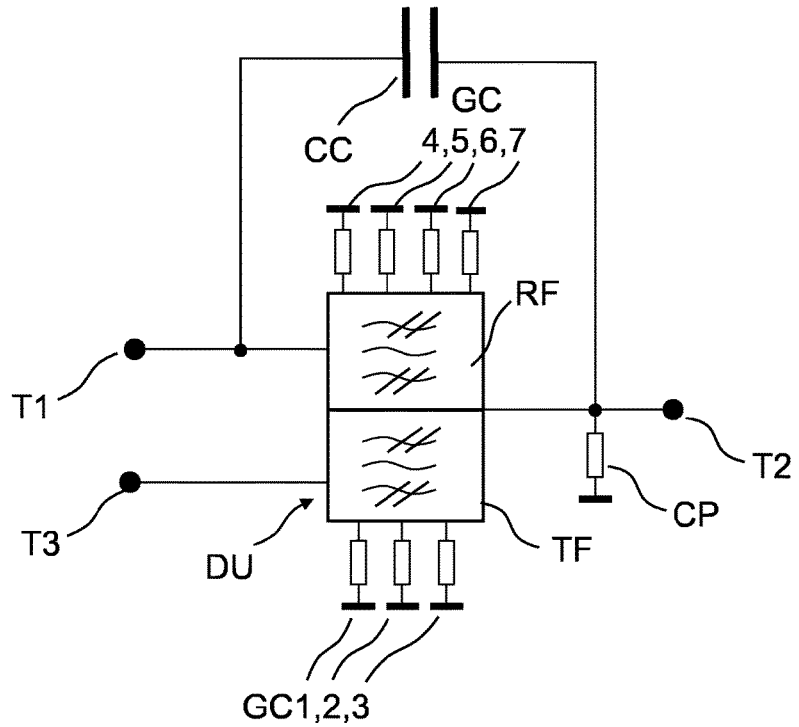
Figure 7:
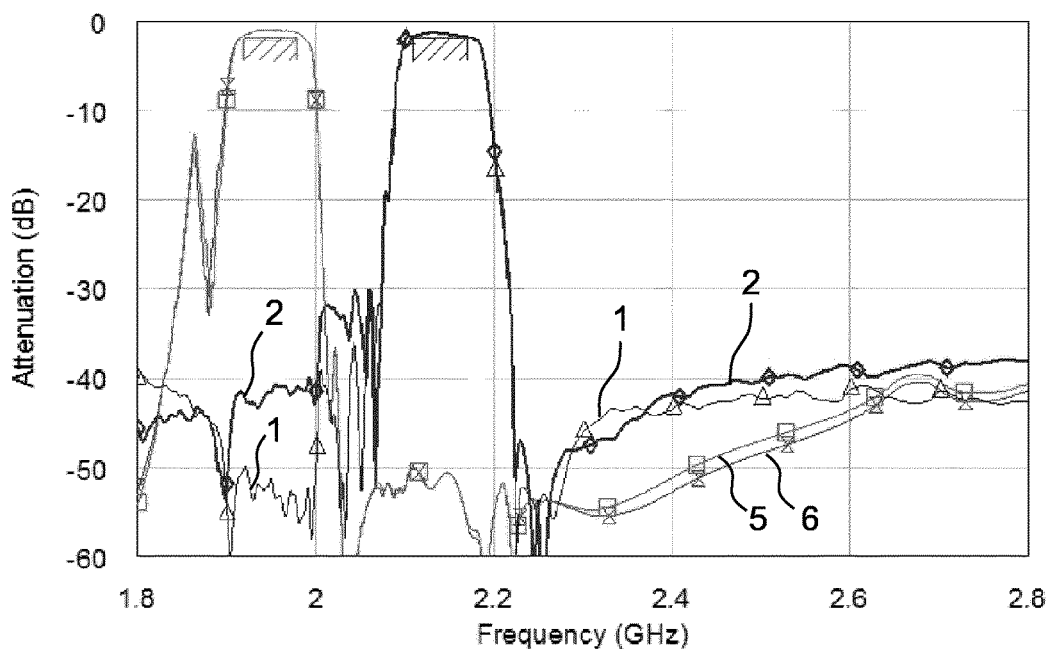
Figure 8:
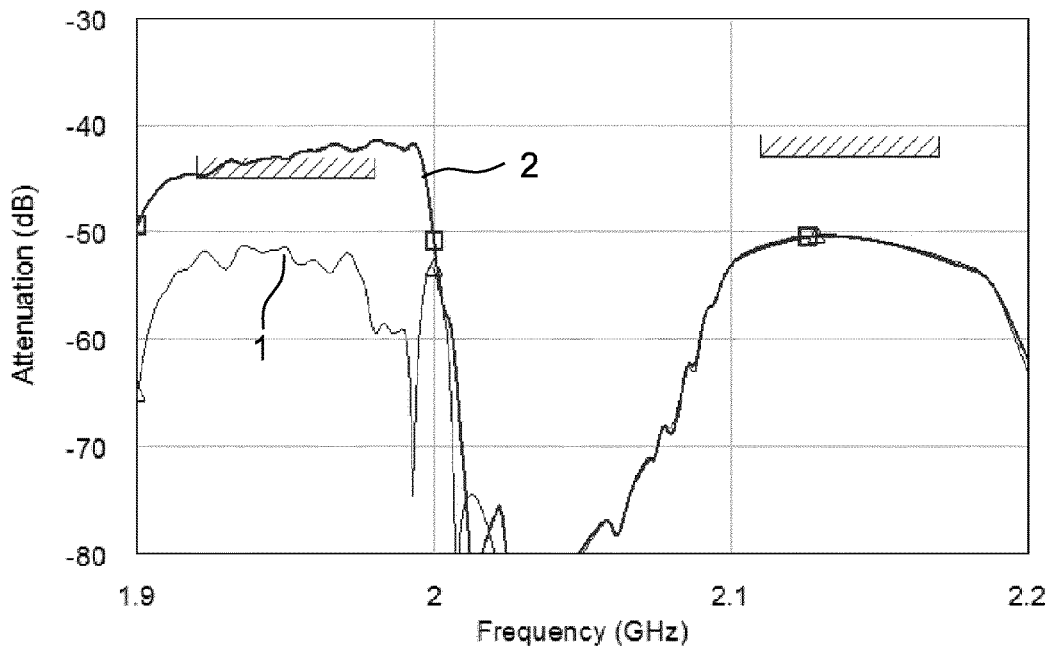
Figure 9:
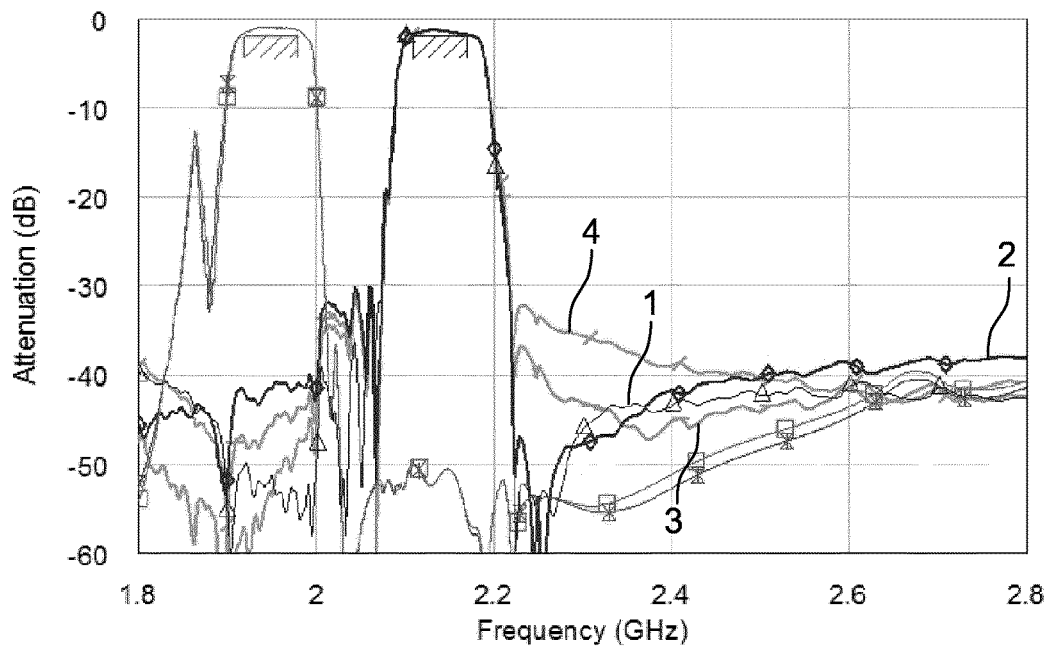
Figure 10:
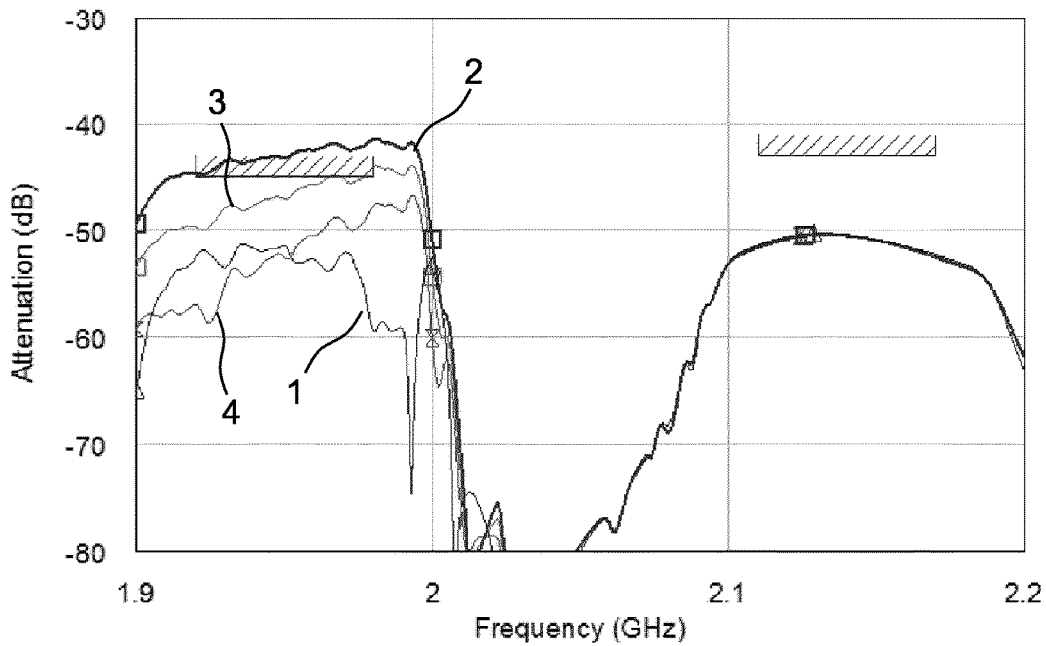

FIG. 1 shows a frequency filter according to a simple embodiment of the invention, FIG. 2 shows a block diagram of a duplexer according to a filter arrangement of another embodiment, FIG. 3 shows a third embodiment that is a two-in-one filter, FIG. 4 shows the transfer function of one of the two-in-one filters of the third embodiment, FIG. 5 shows a zoomed detail of FIG. 4, FIG. 6 shows a fourth embodiment of the invention where the filter arrangement is a duplexer, FIG. 7 shows the transfer function of the duplexer of the fourth embodiment of FIG. 6, FIG. 8 shows the isolation of the duplexer of FIG. 6, FIG. 9 shows the transfer function of an inventive duplexer according to FIG. 6, FIG. 10 shows the isolation of the duplexer of FIG. 6.

FIG. 1 shows a most simple first embodiment of the invention. The filter arrangement comprises a frequency filter F that is embodied as a band pass filter. The first and second terminal T1 and T2 are input and output terminals of the frequency filter F. The frequency filter F has a bad ground connection GC which is simulated as an inductance L coupled to this ground connection GC. According to the invention, a negative effect of the disturbing inductance L is compensated by a compensating capacitor CC which is coupled in parallel to the frequency filter F. It is assumed that the disturbing inductance has a value of smaller than 1 nH while the compensating capacitance CC has a capacitance between about 1.0 to 50 fF.

FIG. 2 shows another embodiment of the invention where the filter arrangement comprises a duplexer DU construed from a first frequency filter F1 and a second frequency filter F2. It is assumed that the duplexer has a bad ground connection that can be simulated by a further inductance L connected to a ground connection of the duplexer DU and especially to a ground connection of the first filter F1. This disturbing inductance is not shown in this figure.

For compensating this disturbing inductance, a compensating capacitor CC is coupled in parallel to the first filter F1. Hence, the compensating capacitor CC bridges first and second terminals T1 and T2. In a preferred embodiment, the second terminal T2 is assigned to an antenna terminal of the duplexer DU and the first terminal T1 is assigned to a receiving input (RX section). By selecting a proper capacitance value of the compensating capacitor CC, a compensation of the disturbing effect of the bad ground connection of the duplexer can be compensated at least partly.

FIG. 3 shows a block diagram of a third embodiment according to a given two-in-one filter F that is already on the market. The filter arrangement (two-in-one filter) comprises a first filter that is connected between a first terminal T1 and a second terminal T2. The second filter of the filter arrangement is coupled between a third terminal T3 and a fourth terminal T4.

The two-in-one filter comprises six ground connections GC1 to GC6 that are in an ideal case without any intrinsic inductance. But in a real environment when the two-in-one filter is mounted to a substrate having a bad ground, the ground connections GC are disturbed which can be simulated by an inductance each coupled to each of the ground connections GC. For a simulation of the performance of this two-in-one filter, it is assumed that each of the disturbing inductances has an inductance value of about 0.6 nH each. To compensate for this bad ground connection, a compensating capacitor CC is coupled in parallel to the first filter that is between first and second terminal T1, T2.

When performing a simulation with two different capacitance values of the compensating capacitors GC the result thereof is different for the different capacitance values.

FIG. 4 shows the result of the simulation calculation according to the two-in-one filter depicted in FIG. 3. In the figure, there are depicted four curves, each curve assigned to a transfer function between terminals T1 and T2 of the first filter of the two-in-one filter.

The first curve 1 is assigned to an ideal filter F with a good ground connection that has no intrinsic disturbing inductance. Hence, no compensating capacitor has to be simulated. Curve 2 shows the transfer function of the first filter of FIG. 3 with a bad ground but without a compensating capacitor. The figure shows that the attenuation of the second transfer function according to curve 2 had a decreased attenuation below the passband. For frequencies above the passband a pole with high attenuation is formed. But in the upper stop band, the attenuation is bad with respect to the ideal curve 1.

The third curve 3 shows the transfer function between first and second terminal T1, T2 for a filter according to FIG. 3 with a bad ground connection but with a compensating capacitor according to the invention with a capacitance value of 10 fF. Curve 4 of FIG. 4 shows the respective compensated transfer function where the capacitance value of the compensating capacitor CC is set to 20 fF.

It can be shown that both set values of the compensating capacitors CC can improve the attenuation of the filter in the stop band. But in this embodiment, the higher capacitance value of 20 fF for the compensating capacitor CC shows the best result. This may be true only for this example where the disturbance of the ground connections are assumed to be about 0.6 nH. For other examples, an optimal compensating capacitance may be found at higher or lower values.

FIG. 5 shows an enlarged section of FIG. 4 for a frequency range below the passband. In this region, too, the compensating capacitance value of 20 fF shows the best result, that is the best attenuation in the lower stop band.

FIG. 6 shows a block diagram of a fourth embodiment of the invention that is a duplexer that is already on the market. The filter arrangement (duplexer DU) comprises a receiving filter RF that is a first frequency filter connected between terminal T1 and terminal T2, where T2 is an antenna terminal of the duplexer. The second frequency filter of the duplexer DU is a transmission filter TF connected between terminal T3 and the antenna terminal T2. For a simulation for the inventive effect, a duplexer for WCDMA band 1 is used. This duplexer DU has seven ground connections GC1 to GC7. In an ideal case where each of the ground connections has nearly ideal ground, no compensating capacitor is used but two of the ground connections are set to an inductance of 1.2 nH and 1.8 nH, respectively according to a design optimization of duplexer DU. In a disturbed case, the remaining five ground connections are disturbed by an assumed disturbing inductance value of 0.2 nH for each of the disturbed ground connections GC while the inductance values of the designed in inductances are unchanged at the set value.

For compensating the disturbing inductances at the ground connections GC3 to GC7, a compensating capacitor CC is coupled in parallel to the receiving filter RF that is between first and second terminal T1, T2. A matching coil AC is coupled to the signal line near the second terminal T2 that is near the antenna terminal to compensate for the capacitive behavior of the filters.

FIG. 7 shows the transfer functions of the filter of FIG. 6 without compensating capacitor CC. The left passband refers to the transmission filter TF and comprises two curves 5, 6 wherein curve 5 accords to the TX transfer function of an ideal duplexer, respectively to an ideal transmission filter TF of the duplexer DU. Curve 6 accords to the simulation result of the duplexer that is disturbed and hence has bad ground connections GC3 to GC7.

Curve 1 is the transfer function of the receiving filter RF with an optimized and undisturbed ground connection. Curve 2 belongs to the transfer function of the receiving filter RF where the ground connections are disturbed by said inductance values of 0.2 nH each.

FIG. 8 shows the isolation of the duplexer DU of FIG. 6 (without compensating capacitor CC). Curve 1 shows the isolation for an undisturbed duplexer and curve 2 shows the isolation for a disturbed duplexer. Already on the first view, one can see that the isolation of the disturbed duplexer according to curve 2 has worsened with respect to curve 1 by about 15 dB, which is a value which is not acceptable for a duplexer.

FIG. 9 is a similar figure like FIG. 7 but shows transfer functions including those with an inserted compensating capacitance parallel to the receiving filter RF. Curves 1 and 2 are the same as the respective curves 1 and 2 in FIG. 7. Curve 1 shows an ideal transfer function of receiving filter RF with an undisturbed ground connection and without compensating capacitor. Curve 2 shows the respective case where the ground connections are disturbed.

Curve 3 accords to the transfer function of the receiving filter according to an inventive duplexer according to FIG. 6 where the compensating capacitor CC is set to a value of 15 fF.

Curve 4 accords to an embodiment where the compensating capacitor value is set to 30 fF.

The diagram shows that in this embodiment too, the higher value of the compensating capacitance achieves the better result with respect to attenuation in the upper and lower stop band. But this may be true only for this embodiment with the assumed disturbance values of 0.2 nH at each ground connection.

FIG. 10 shows the isolation of the duplexer of FIG. 6 for an ideal case without disturbing ground connections and without compensating capacitor (curve 1), for a duplexer with disturbed ground connections without compensating capacitor (curve 2), for a duplexer with disturbed ground connections but with a compensating capacitor of 15 fF (curve 3) while curve 4 shows the duplexer with a compensating capacitance value that is set to 30 fF. The figure shows that for the isolation, too, the better compensating value for this example is the 30 fF capacitance.

As the invention has been explained by means of a few embodiments only, the scope of the invention shall not be restricted to these embodiments. The invention can be used in any filter which is part of a filter arrangement comprising an arbitrary number of further filters that may be connected therewith or not. The invention is useful for all filters that have bad ground connections that are degrading the filter properties which may be compensated by the inventive capacitor connected in parallel to one of the filters.

LIST OF REFERENCE CHARACTERS

F, F1, F2 frequency filter
T1, T2 first and a second terminal
CC capacitance
L disturbing inductance
DU duplexer
RF receiving filter
CP Parallel inductance at antenna terminal
GC Ground connection

The invention claimed is:

1. A filter arrangement, comprising
a frequency filter connected between a first terminal and a second terminal, the frequency filter being coupled to a ground connection; and
a capacitive element coupled in parallel to the frequency filter, wherein
a capacitance of the capacitive element is between 1 and 50 fF; and
the capacitive element and an inductive element associated with the ground connection form a resonator, a resonance frequency of the resonator being set within a stop band of the frequency filter.

2. The filter arrangement of claim 1, wherein the filter arrangement comprises a duplexer (DU).

3. The filter arrangement of one of claim 1 or 2, wherein the frequency filter is a receiving filter, and wherein the capacitive element is coupled between an input and an output of the receiving filter.

4. The filter arrangement of claim 1, wherein the frequency filter is a receiving filter of a duplexer, the duplexer comprising the receiving filter and a transmission filter, and wherein the resonance frequency is within a passband of the transmission filter.

5. The filter arrangement of one of claims 1, 2, and 4, wherein the first terminal and the second terminals are input and output terminals of the frequency filter, one of the first terminal and the second terminal being an antenna terminal.

* * * * *